(12) United States Patent
Mitsui

(10) Patent No.: US 6,603,695 B2
(45) Date of Patent: Aug. 5, 2003

(54) SEMICONDUCTOR MEMORY DEVICE HAVING SELF-REFRESH MODE

(75) Inventor: Katsuyoshi Mitsui, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/142,156

(22) Filed: May 10, 2002

(65) Prior Publication Data

US 2003/0043671 A1 Mar. 6, 2003

(30) Foreign Application Priority Data

Aug. 30, 2001 (JP) ........................................ 2001-260898

(51) Int. Cl.[7] ................................................ G11C 7/00
(52) U.S. Cl. ...................................... 365/222; 365/228.7
(58) Field of Search ............................... 365/222, 225.7, 365/149, 239

(56) References Cited

U.S. PATENT DOCUMENTS 5,812,475 A * 9/1998 Lee et al. .................... 365/222

FOREIGN PATENT DOCUMENTS

JP 2000-163955 6/2000

* cited by examiner

Primary Examiner—Tan T. Nguyen
(74) Attorney, Agent, or Firm—McDermott, Will & Emery

(57) ABSTRACT

An address generating circuit of a DRAM includes five fuses, a trimming switching circuit generating five signals in accordance with whether or not each fuse is blown, a voltage converting circuit generating a control voltage of a level corresponding to the five signals, a voltage control oscillation circuit generating a clock signal of a cycle according to the control voltage, and an address counter generating an address signal in synchronization with the clock signal. Thus, unlike a conventional example, a plurality of counting circuits and a detection circuit are eliminated, resulting in reduction of power consumption and circuit scale.

6 Claims, 16 Drawing Sheets

SEMICONDUCTOR MEMORY DEVICE HAVING SELF-REFRESH MODE

BACKGROUND OF THE INVENTION

1. Field of the Invention

The present invention relates to a semiconductor memory device, and more particularly, to a semiconductor memory device having a self-refresh mode.

2. Description of the Background Art

Conventionally, a dynamic random access memory (hereinafter referred to as DRAM) is provided with an address generating circuit that, in response to an instruction for execution of self-refresh, sequentially generates a plurality of address signals one by one, which are pre-allocated to a plurality of memory cell rows respectively, with a predetermined cycle, and designates memory cell rows to be refreshed by the generated address signals.

FIG. 11 is a block diagram showing the configuration of such an address generating circuit 150. Referring to FIG. 11, address generating circuit 150 includes a constant current circuit 151, a voltage converting circuit 152, a voltage control oscillation circuit 153, a count control signal generating circuit 154, a trimming switching circuit 155, five counting circuits 156 to 160, a detection circuit 161, and an address counter 162.

Constant current circuit 151 generates constant current of a predetermined value, and outputs a constant voltage VBN of a value corresponding to the constant current. Voltage converting circuit 152 is activated in response to a self-refresh instruction signal SR being set to an activated level of a logic high or "H" level, and converts output voltage VBN of constant current circuit 151 into a constant voltage VB of a predetermined value. Voltage control oscillation circuit 153 is activated in response to self-refresh instruction signal SR being set to the activated level of "H" level, and generates a clock signal CLK having a cycle obtained by dividing a refresh cycle by an integer, in accordance with output voltage VB of voltage converting circuit 152.

Count control signal generating circuit 154 includes, as shown in FIG. 12, inverters 163 to 165, a delay circuit 166, an NAND gate 167 and an NOR gate 168. Clock signal CLK generated at voltage control oscillation circuit 153 is input into one input node of each of NAND gate 167 and NOR gate 168 via inverter 163, delay circuit 166 and inverter 164, and is also input into the other input node of each of NAND gate 167 and NOR gate 168. As shown in FIG. 13, delay circuit 166 includes an even number (six in FIG. 13) of inverters 171 to 176 connected in series. An output clock signal of NAND gate 167 is inverted at inverter 165 to be a count clock signal CK1. An output clock signal of NOR gate 168 is a determination clock signal CK2. Each of clock signals CK1 and CK2 has the same cycle as that of clock signal CLK, and both clock signals CK1 and CK2 are non-overlapped two-phase clock signals that are not set to the "H" level at a time.

Referring again to FIG. 11, trimming switching circuit 155 includes five fuses, and is activated by output voltage VBN of constant current circuit 151, setting each of signals φ0 to φ4 to be at the "H" level or an "L (logic low)" level, depending on the state of each of the five fuses (i.e. whether or not each fuse blown). Signals φ0 to φ4 are applied to counting circuits 156 to 160 respectively.

Referring to FIG. 14, counting circuit 156 includes inverters 180 to 186, transfer gates 187 to 189, and clocked inverters 190, 191. Inverters 182, 183, 190 and 191, and transfer gates 188, 189 constitute a flip-flop 192. Flip-flop 192 captures a level of an input terminal 192a when count clock signal CK1 is at the "L" level, and outputs a signal of the captured level in response to count clock signal CK1 being raised from the "L" level to the "H" level. Inverter 184 is connected between an output terminal 192b and input terminal 192a of flip-flop 192. An output signal of inverter 180 is inverted at inverter 186 to be an output clock signal CY0 of counting circuit 156. Therefore, clock signal CY0 is a signal obtained by frequency-dividing clock signal CK1 by two.

Inverters 180, 181 and transfer gate 187 constitute a preset circuit. Transfer gate 187 is rendered conductive while preset signal PR is at an activated level of "H" level, and a signal φ0 is applied to a latch circuit constituted by inverters 183, 191 via inverter 180 and transfer gate 187. This makes signal φ0 and output clock signal CY0 be at the same logic level.

Counting circuit 157 is formed, as shown in FIG. 15, by removing inverter 181 from counting circuit 156 and adding NAND gates 193, 194, inverters 195, 196 and a transfer gate 197 thereto. Moreover, flip-flop 192 operates in synchronization with output clock signal CY0 of counting circuit 156, in place of count clock signal CK1. Thus, output clock signal CY1 of counting circuit 157 is a signal obtained by frequency-dividing output clock signal CY0 of counting circuit 156 in the previous stage by two.

Inverters 180, 195, 196, transfer gates 187, 197, and NAND gates 193, 194 constitute a preset circuit. When preset signal PR is set to the "H" level while clock signal CY0 is at the "H" level, transfer gate 197 is rendered conductive, and a signal φ1 is applied to a latch circuit constituted by inverters 182 and 190 via transfer gate 197. When preset signal PR is set to the "H" level while clock signal CY0 is at the "L" level, transfer gate 187 is rendered conductive, and signal φ1 is applied to a latch circuit constituted by inverters 183 and 191 via inverter 180 and transfer gate 187. In either case, signal φ1 and output clock signal CY1 have the same logic level.

Counting circuits 158 to 160 have the same configuration as that of counting circuit 157. Counting circuit 158 outputs a clock signal CY2 obtained by frequency-dividing output clock signal CY1 of counting circuit 157 by two. Counting circuit 159 outputs a clock signal CY3 obtained by frequency-dividing output clock signal CY2 of counting circuit 158 by two. Counting circuit 160 outputs a clock signal CY4 obtained by frequency-dividing output clock signal CY3 of counting circuit 159 by two. Thus, output clock signals CY0 to CY4 of counting circuits 156 to 160 have frequencies twice, four times, eight times, sixteen times and thirty-two times, respectively, as much as the frequency of clock signal CK1. Moreover, the timing of rising edges of clock signals CY0 to CY4 can be changed by trimming switching circuit 155.

As shown in FIG. 16, detection circuit 161 includes NAND gates 201 to 207, an NOR gate 208 and an inverter 209, in which NAND gates 205 and 206 constitute a flip-flop 210. NAND gate 201 receives clock signals CY0 to CY2, NAND gate 202 receives clock signals CY3 and CY4, and NOR gate 208 receives output signals of NAND gates 201 and 202. NAND gate 203 receives a determination clock signal CK2 and a self-refresh instruction signal SR, and the output signal thereof is input into a reset terminal 210b of flip-flop 210 via inverter 209. NAND gate 204 receives an output signal φ208 of NOR gate 208 and an output signal of inverter 209, and an output signal of NAND gate 204 is input into a set terminal 210a of flip-flop 210. An output signal of flip-flop 210 is a signal PHYS indicating a refresh cycle. NAND gate 207 receives an inversion output signal of flip-flop 210 and self-refresh instruction signal SR, and outputs a preset signal PR.

When self-refresh instruction signal SR is at the "L" level, the output signal of inverter 209 is fixed at the "L" level, resetting flip-flop 210, and thus signal PHYS is set to the "L" level, whereas preset signal PR is set to the "H" level. When self-refresh instruction signal SR is at the "H" level, each of NAND gates 203 and 207 operates as an inverter. When at least one of clock signals CY0 to CY4 is at the "L" level, output signal $\phi 208$ of NOR gate 208 is lowered to the "L" level and set terminal 210a of flip-flop 210 is raised to the "H" level, while determination clock signal CK2 is input into reset terminal 210b of flip-flop 210 via NAND gate 203 and inverter 209. This resets flip-flop 210, making both of signal PHYS and preset signal PR be at the "L" level.

When all of clock signals CY0 to CY4 are set to the "H" level, output signal $\phi 208$ of NOR gate 208 is raised to the "H" level, and NAND gate 204 operates as an inverter. Thus, flip-flop 210 is set in response to a rising edge of clock signal CK2, and is reset in response to a falling edge of clock signal CK2. Clock signal CY0 has a cycle twice as long as that of clock signal CK2, so that flip-flop 210 is set only once. When flip-flop 210 is set, both of signal PHYS and preset signal PR are set to the "H" level, whereas when flip-flop 210 is reset, both of signal PHYS and preset signal PR are lowered to the "L" level. Therefore, counting circuits 156 to 160 and detection circuit 161 constitute a 5-bit subtraction counting circuit. An initial value of the subtraction counting circuit is set by trimming switching circuit 155, and subtraction is performed in synchronization with count clock signal CK1.

Referring again to FIG. 11, address counter 162 is activated by self-refresh instruction signal SR, and counts the number of pulses of output clock signal PHYS in detection circuit 161 to output address signals A0 to A11. Therefore, address signals A0 to A11 are incremented with the same cycle as that of clock signal PHYS. Every time one of address signals A0 to A11 is output, data in one memory cell row is refreshed. When address counter 162 counts up, refresh of data is terminated for all the memory cell rows.

However, conventional address generating circuit 150 generates reference clock signal CLK by voltage control oscillation circuit 153, and generates five clock signals CY0 to CY4 by sequentially frequency-dividing clock signal CLK at counting circuits 156 to 160, to obtain a refresh cycle based on such clock signals CY0 to CY4. This has disadvantageously increased power consumption and circuit scale of voltage control oscillation circuit 153 and counting circuits 156 to 160.

SUMMARY OF THE INVENTION

Therefore, a principle object of the present invention is to provide a semiconductor memory device having small power consumption and circuit scale.

According to one aspect of the present invention, a semiconductor memory device includes a voltage control oscillation circuit generating a clock signal with a cycle according to a control voltage; a refresh execution circuit activated during a self-refresh mode, to sequentially select a plurality of memory cell rows in synchronization with the clock signal and to refresh data in selected memory cell rows; a signal generating circuit including at least one fuse, and outputting a signal for setting a cycle of the clock signal based on whether or not the fuse is blown; and a voltage generating circuit generating a control voltage for the voltage control oscillation circuit in accordance with an output signal of the signal generating circuit. Thus, self refresh is performed in synchronization with the output clock signal of the voltage control oscillation circuit, allowing smaller power consumption and circuit scale, compared to the conventional case in which a plurality of clock signals were generated by frequency-dividing a reference clock signal, generated at the voltage control oscillation circuit, by a plurality of counting circuits, to perform self-refresh based on the generated plurality of clock signals.

Preferably, the voltage generating circuit includes a constant current circuit supplying constant current of a predetermined value to an output node for outputting the control voltage; a plurality of diode elements; and a switching circuit selecting any one or more of the plurality of diode elements in accordance with an output signal of the signal generating circuit, and connecting each selected diode element between the output node and a line of a reference potential. Thus, by changing the number of diode elements connected between the output node and the line of the reference potential, the control voltage can be changed.

More preferably, the diode element includes a transistor whose input electrode and one conduction electrode are connected, and a plurality of transistors included in the plurality of diode elements have different sizes. Thus, multiple stages of control voltages can be generated by a small number of diode elements.

More preferably, the sizes of the plurality of transistors are sequentially doubled. This can generate a control voltage obtained by multiplying a control voltage to be a reference by a desired integer.

More preferably, the switching circuit of the voltage generating circuit includes a plurality of switching elements provided to correspond to the plurality of diode elements respectively, each of which is connected in series with a corresponding diode element, between said output node and the line of said reference potential. The fuse of the signal generating circuit is provided in a number equal to the number of the switching elements, to correspond to each switching element. The signal generating circuit further includes a driving circuit provided corresponding to each fuse, to render a corresponding switching element conductive or non-conductive in response to a corresponding fuse being blown. Thus, the switching circuit and signal generating circuit can easily be configured.

More preferably, the signal generating circuit further includes a selection circuit selecting whether the driving circuit renders a corresponding switching element conductive or non-conductive, in response to a corresponding fuse being blown. Thus, the number of fuses to be blown can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
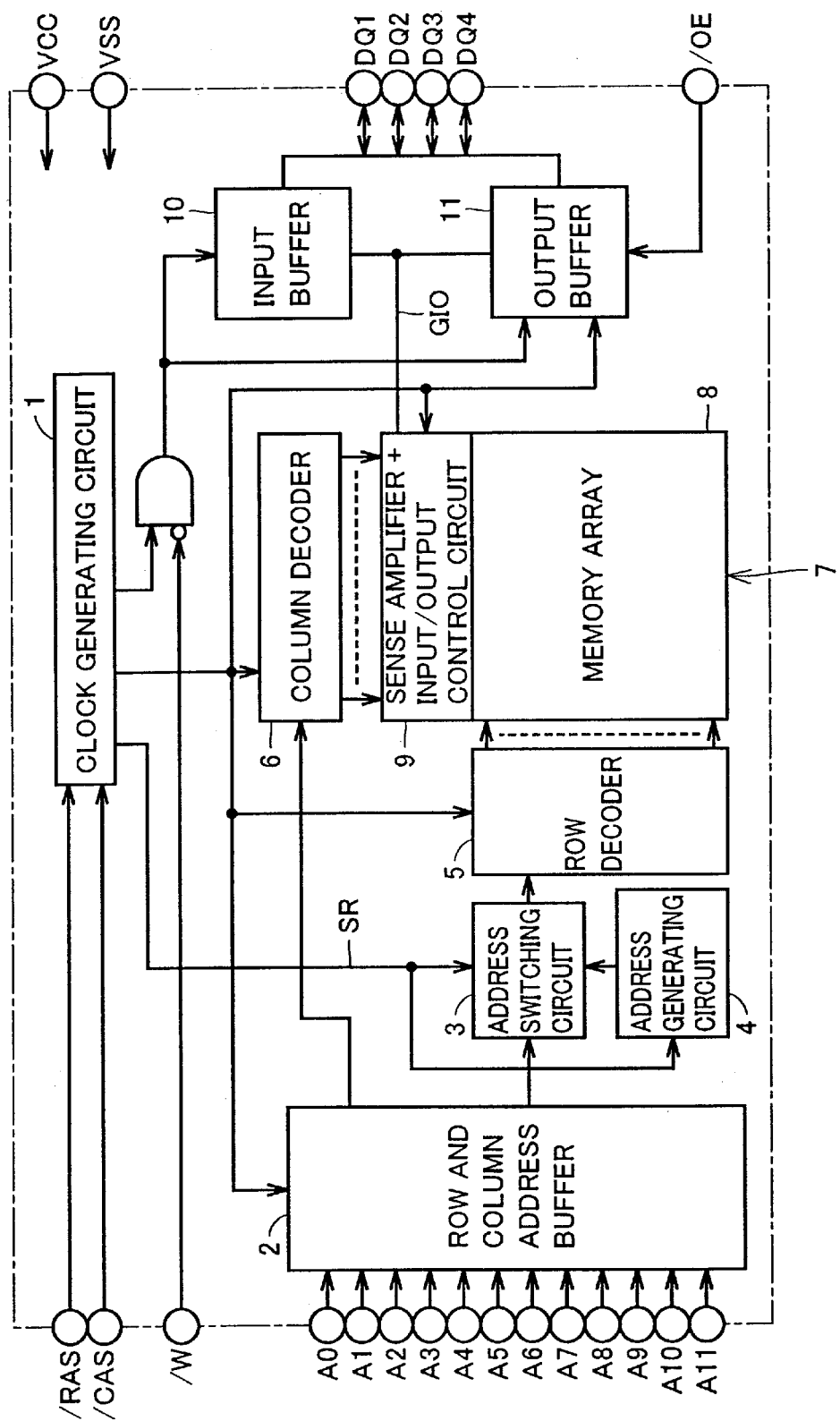
FIG. 1 is a block diagram showing the entire configuration of a DRAM according to an embodiment of the present invention.

FIG. 1 is a block diagram showing the entire configuration of a DRAM according to an embodiment of the present invention.

Referring to FIG. 1, the DRAM includes a clock generating circuit 1, a row and column address buffer 2, an address switching circuit 3, an address generating circuit 4, a row decoder 5, a column decoder 6, a memory mat 7, an input buffer 10, and an output buffer 11. Memory mat 7 includes a memory array 8 and a sense amplifier+input/output control circuit 9.

Clock generating circuit 1 selects a predetermined operation mode in accordance with externally-applied control signals /RAS, /CAS, and controls the entire DRAM.

Row and column address buffer 2 selectively supplies externally-applied address signals A0 to A11 to row decoder 5 and column decoder 6, at the time of reading and writing operations. Address generating circuit 4 is activated by self-refresh instruction signal SR output from clock generating circuit 1, and generates address signals A0 to A11 for refresh at the time of refreshing operation. Address switching circuit 3 is controlled by self-refresh instruction signal SR, to couple row and column address buffer 2 and row decoder 5 at the time of reading and writing operations, whereas to couple address generating circuit 4 and row decoder 5 at the time of refresh operation.

Memory mat 7 includes a plurality of memory cells arranged in a matrix of rows and columns. A memory cell stores 1-bit data. A plurality of memory cells are pre-divided into groups, each of the groups having a prescribed number (e.g. four) of memory cells. Unique row address and column address are allocated in advance to each memory cell group.

Row decoder 5 designates a row address of memory array 8 in response to address signals A0 to A11 supplied from row and column address buffer 2 or address generating circuit 4. Column decoder 6 designates a column address of memory 8 in response to address signals A0 to A11 supplied from row and column address buffer 2.

Sense amplifier+input/output control circuit 9 connects, at the time of reading and writing operations, a memory cell of an address designated by row decoder 5 and column decoder 6 to one end of a global signal input/output line pair GIO. Moreover, sense amplifier+input/output control circuit 9 refreshes data of a memory cell at a row address designated by row decoder 5 at the time of refreshing operation.

The other end of global signal input/output line pair GIO is connected to input buffer 10 and output buffer 11. Input buffer 10 supplies externally-applied data D to a memory cell selected via global signal input/output line pair GIO in response to an externally-applied control signal /W, at the time of writing operation. Output buffer 11 outputs, at the time of reading operation, data Q read from the selected memory cell to the outside, in response to an externally-applied signal /OE.

Figure 2:
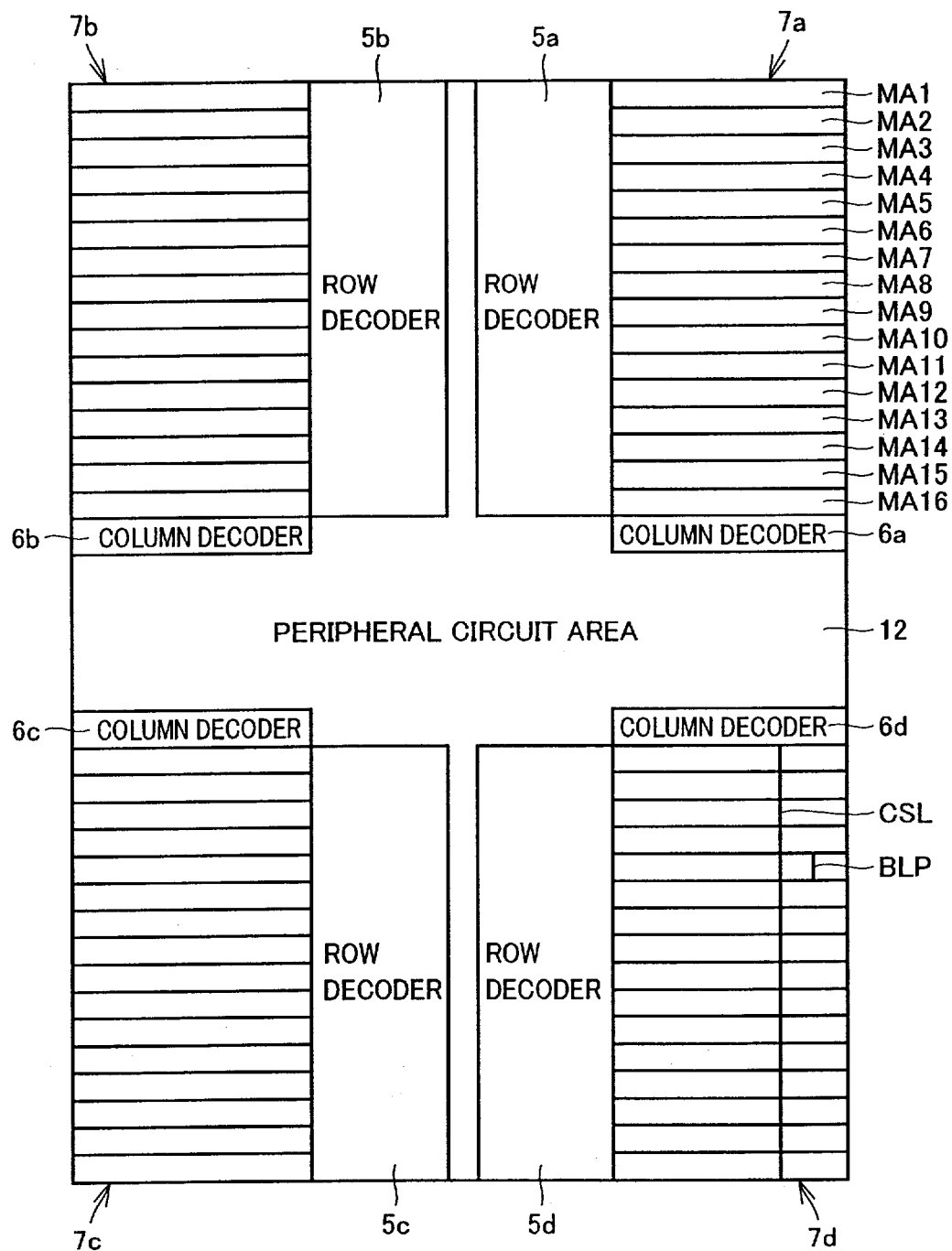
FIG. 2 shows a chip layout of the DRAM shown in FIG. 1.

FIG. 2 shows a chip layout of the DRAM shown in FIG. 1. Referring to FIG. 2, the DRAM includes four memory mats 7a to 7d respectively arranged at four corners of a rectangular chip. Each of memory mats 7a to 7d includes sixteen memory arrays MA1 to MA16. Four memory mats 7a to 7d constitute memory mat 7 shown in FIG. 1.

For memory mats 7a to 7d, row decoders 5a to 5d are respectively arranged, along the long side of the chip, at portions adjacent to a chip middle portion. Row decoders 5a to 5d constitute row decoder 5 in FIG. 1. For memory mats 7a to 7d, column decoders 6a to 6d are respectively arranged, along the short side of the chip, at portions adjacent to the chip middle portion. Column decoders 6a to 6d constitute column decoder 6 in FIG. 1. Clock generating circuit 1 shown in FIG. 1 and the like are arranged in a peripheral circuit area 12 of the chip middle portion.

Figure 3:
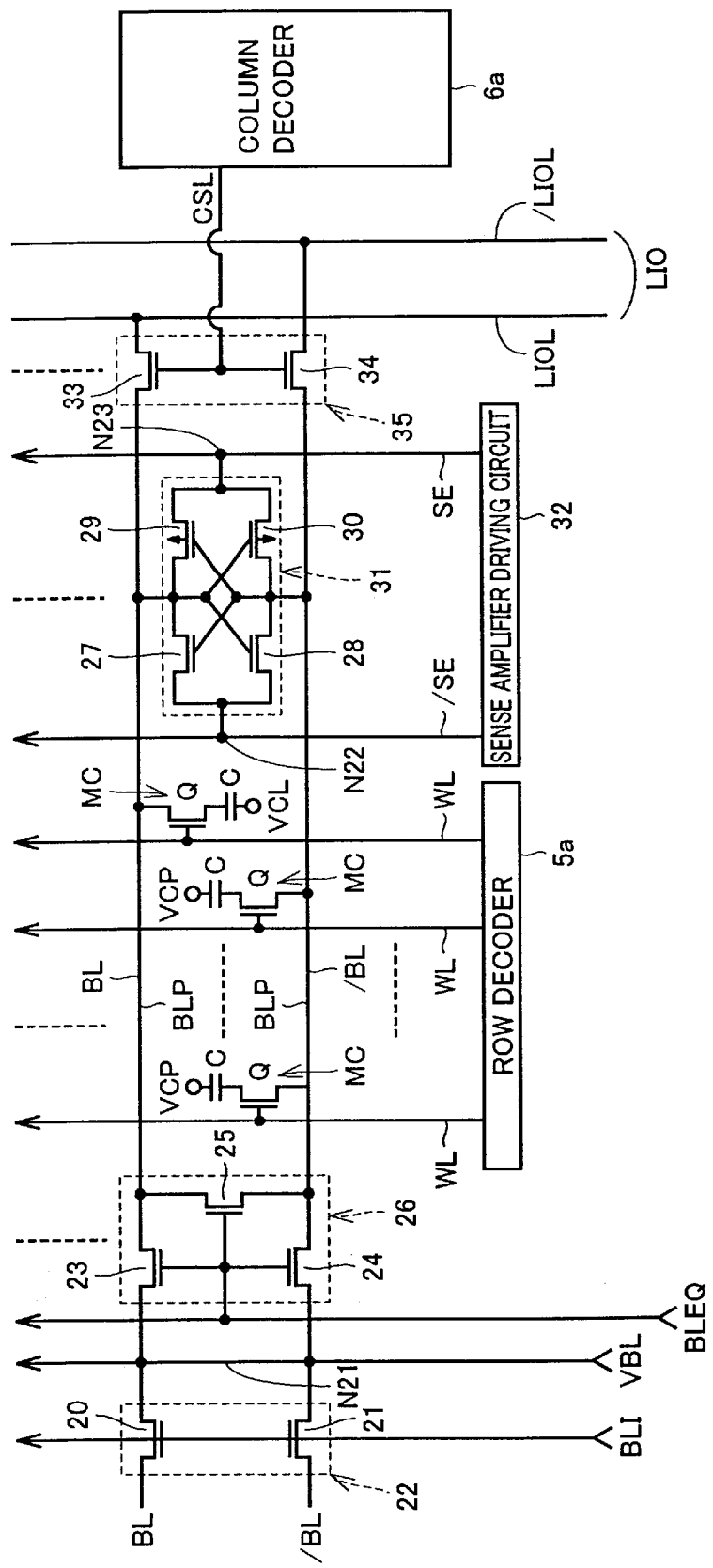
FIG. 3 is a circuit diagram showing the configuration of a memory array MA16 shown in FIG. 2.

FIG. 3 is a circuit block diagram partially showing the configuration of memory array MA16 of memory mat 7a shown in FIG. 2. Referring to FIG. 3, memory array MA16 includes a plurality of memory cells MC arranged in a matrix of rows and columns, a word line WL provided corresponding to each of memory cell rows, and a bit line pair BLP provided corresponding to each of memory cell columns. Each of memory cells MC includes an MOS transistor Q for accessing and a capacitor C for storing information. Word line WL transmits an output of row decoder 5a, and activates memory cells MC in a selected row. Bit line pair BLP includes bit lines BL, /BL on which complimentary signals are transmitted, which are used for input/output of data signals into/from a selected memory cell MC.

A bit-line equalizing circuit 26 for equalizing bit lines BL, /BL to have a bit-line precharge potential VBL (=VCC/2) before selection of a memory cell MC is arranged at one end of bit lines BL, /BL. Bit-line equalizing circuit 26 includes N-channel MOS transistors 23, 24 connected between respective bit lines BL, /BL and a node N21, and an N-channel MOS transistor 25 connected between bit lines BL and /BL. The gates of MOS transistors 23 to 25 receive a bit-line equalization signal BLEQ. Bit-line precharge potential VBL is applied to node N21. Node N21 is connected to bit-line pair BLP of adjacent memory array MA15 via a transfer gate 22. Transfer gate 22 includes N-channel MOS transistors 20, 21, and the gates of N-channel MOS transistors 20, 21 both receive a signal BLI.

Moreover, a sense amplifier 31 is arranged between bit lines BL and /BL for amplifying a small potential difference appearing between bit lines BL and /BL after selection of a memory cell MC. Sense amplifier 31 includes N-channel MOS transistors 27, 28 connected between the respective bit lines BL, /BL and a node N22, and includes P-channel MOS transistors 29, 30 connected between the respective bit lines BL, /BL and a node N23. The gates of MOS transistors 27, 29 are both connected to bit line /BL, whereas the gates of MOS transistors 28, 30 are both connected to bit line BL. Nodes N22 and N23 receive, respectively, sense amplifier activation signals /SE, SE output from a sense amplifier driving circuit 32. Sense amplifier driving circuit 32 is included in clock generating circuit 1 shown in FIG. 1.

Furthermore, the other end of bit lines BL, /BL are connected to one end of local signal input/output lines LIOL, /LIOL via a column selection gate 35. Column selection gate 35 includes N-channel MOS transistors 33, 34 connected, respectively, between bit lines BL, /BL and local signal input/output lines LIOL, /LIOL. The gates of MOS transistors 33, 34 are connected to column decoder 6a via a column selection line CSL. The other end of local signal input/output line pair LIO is connected to one end of global signal input/output line pair GIO in FIG. 1 via a block selection switch (not shown). Each of the other memory arrays MA1 to MA15 has a configuration similar to that of memory array MA16.

Next, the operation of the DRAM shown in FIGS. 1 to 3 is described. In the writing operation, a column selection line CSL in a column according to an address signal is raised to an activated level of "H" level by column decoder 6, to render conductive column selection gate 35 of the column. The clock selection switch (not shown) is also rendered conductive, and thus a selected bit line pair BLP is connected to input buffer 10 via local signal input/output line pair LIO and global signal input/output line pair GIO.

In response to signal /W, input buffer 10 supplies an externally-applied write data signal D to the selected bit line pair BLP via global signal input/output line pair GIO and local signal input/output line pair LIO. Write data D is provided as a potential difference between bit lines BL and /BL. Whereas, a word line WL in a row according to an address signal is raised to the activated level of "H" level by row decoder 5, and MOS transistor Q of memory cell MC in the row is rendered conductive. Capacitor C in the selected memory cell MC stores charge of an amount according to the potential of bit line BL or /BL.

Figure 4:
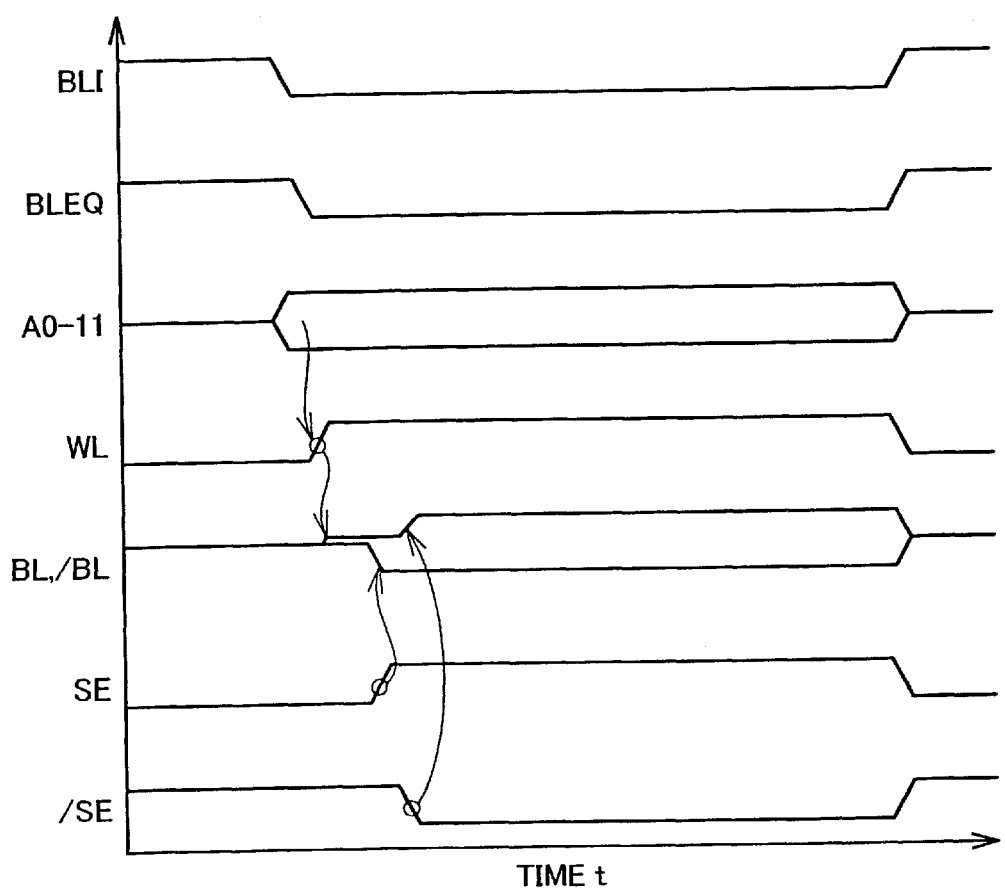
FIG. 4 is a time chart illustrating a refresh operation for one row of the DRAM shown in FIGS. 1 to 3.

The charge of capacitor C in memory cell MC gradually flows out, so that data is refreshed with a predetermined cycle depending on an ability of DRAM. FIG. 4 is a time chart illustrating a refreshing operation for one row. During the self-refresh mode, self-refresh instruction signal SR is raised to the activated level of "H" level by clock generating circuit 1, and address signals A0 to A11 generated at address generating circuit 4 are applied to row decoder 5 via address switching circuit 3.

After signals BLI, BLEQ are lowered to the "L" level and N-channel MOS transistors 20, 21 of transfer gate 22 and N-channel MOS transistors 23 to 25 of equalizing circuit 26 are rendered non-conductive, word line WL in a row according to address signals A0 to A11 is raised to a selected level of "H" level by row decoder 5. Thus, the potential of each of bit lines BL and /BL is changed by a small amount in accordance with an amount of charge of capacitor C in the activated memory cell MC.

Subsequently, sense amplifier driving circuit 32 raises sense amplifier activation signal SE to be at the "H" level while lowering sense amplifier activation signal /SE to be at the "L" level, thereby activating sense amplifier 31. When the potential of bit line BL is higher by a small amount than the potential of bit line /BL, the resistance value of MOS transistors 28, 29 is smaller than the resistance value of MOS transistors 27, 30, so that the potential of bit line BL is raised to the "H" level while the potential of bit line /BL is lowered to the "L" level. On the other hand, when the potential of bit line /BL is higher by a small amount than the potential of bit line BL, the resistance value of MOS transistors 27, 30 is smaller than the resistance value of MOS transistors 28, 29, so that the potential of bit line /BL is raised to the "H" level while the potential of bit line BL is lowered to the "L" level.

When a predetermined period of time has elapsed from the raise of word line WL to the "H" level, word line WL is lowered to the inactivated level of "L" level, terminating refresh of data in one row. At the time of self-refreshing operation, address signals A0 to A11 are incremented with a predetermined cycle, and all word lines WL are sequentially selected using the cycle. Data in each memory cell MC corresponding to a selected word line WL is rewritten into the memory cell MC as shown in FIG. 4.

At the time of reading operation, data in memory cell MC in the row selected by row decoder 5 is read onto bit line pair BLP as in the case with refreshing operation, and data in bit line pair BLP in the column selected by column decoder 6 is applied to output buffer 11 via column selection gate 35, local signal input/output line pair LIO and global signal input/output line pair GIO. Output buffer 11 outputs read data Q to the outside in response to signal /OE.

Figure 5:
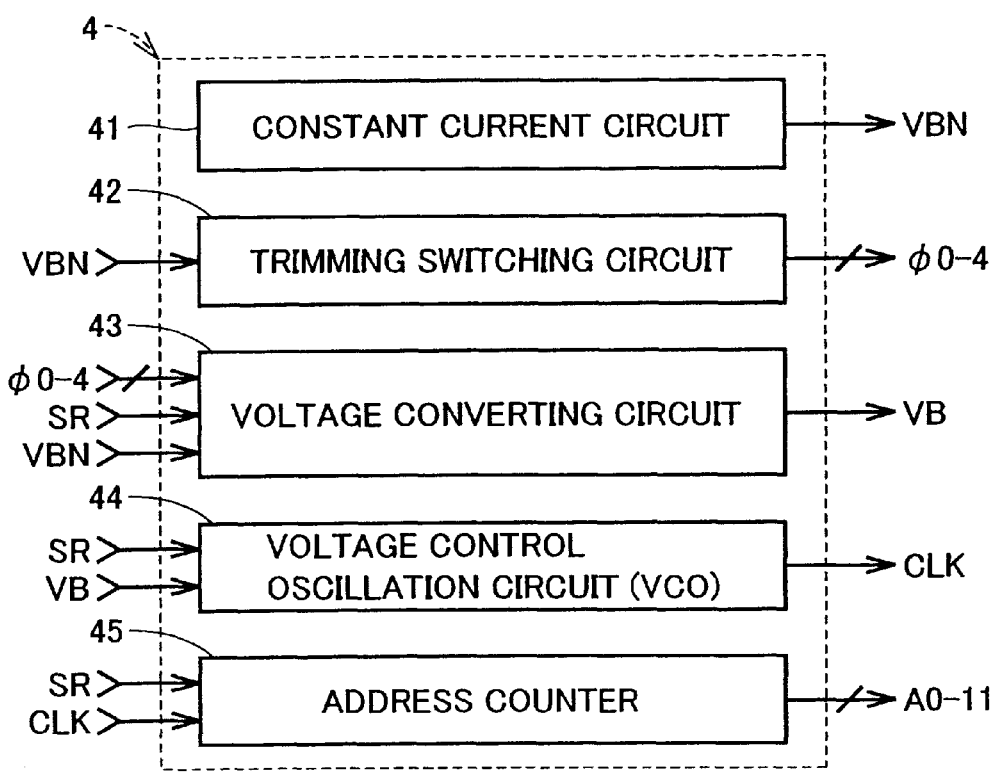
FIG. 5 is a block diagram showing the configuration of an address generating circuit shown in FIG. 1.

The configuration of address generating circuit 4 featured in the DRAM will be described below in detail. Address generating circuit 4 includes, as shown in FIG. 5, a constant current circuit 41, a trimming switching circuit 42, a voltage converting circuit 43, a voltage control oscillation circuit 44, and an address counter 45.

Figure 6:
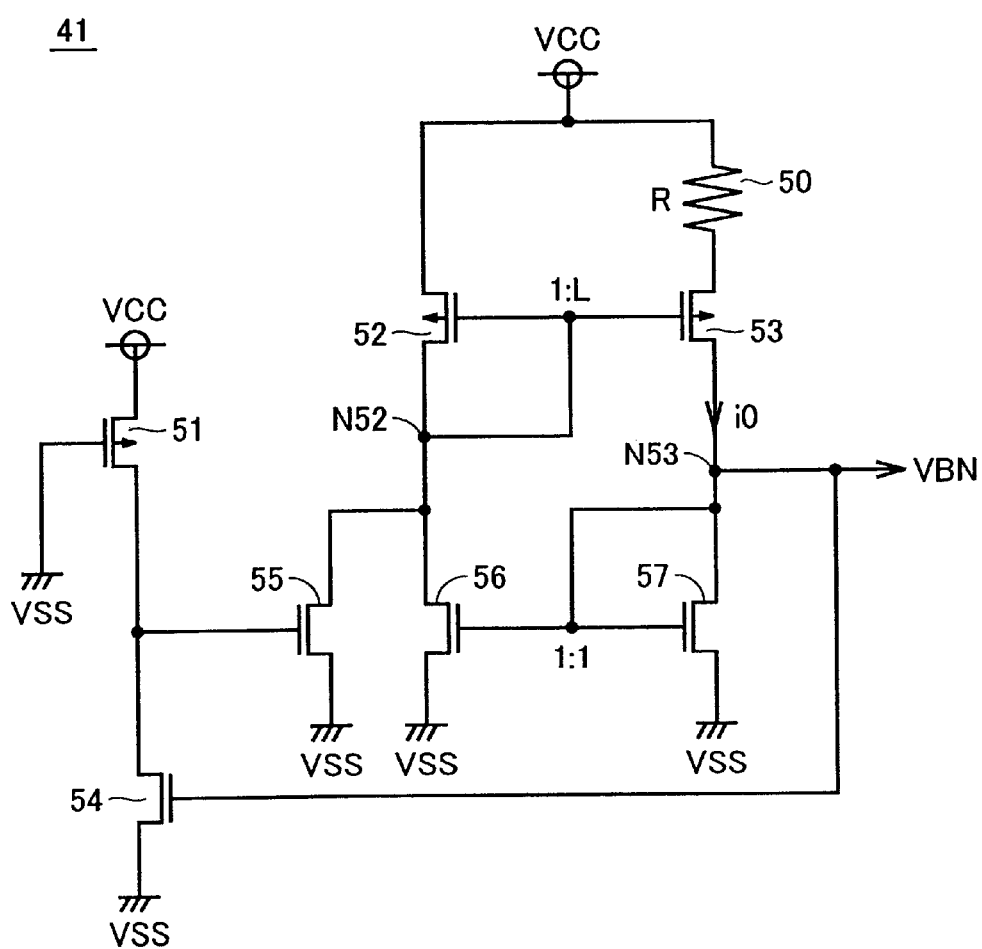
FIG. 6 is a circuit diagram showing the configuration of a constant current circuit shown in FIG. 5.

Constant current circuit 41 includes, as shown in FIG. 6, a resistance element 50, P-channel MOS transistors 51 to 53, and N-channel MOS transistors 54 to 57. P-channel MOS transistor 52 and N-channel MOS transistor 56 are connected in series between the line of a power-supply potential VCC and the line of a ground potential VSS. Likewise, resistance element 50, P-channel MOS transistor 53 and N-channel MOS transistor 57 are connected in series between the line of power-supply potential VCC and the line of ground potential VSS. The gates of P-channel MOS transistors 52, 53 are both connected to the drain of P-channel MOS transistor 52 (i.e. to a node N52). The gates of N-channel MOS transistors 56, 57 are both connected to the drain of N-channel MOS transistor 57 (i.e. to an output node N53). The ratio of the size of P-channel MOS transistor 52 to that of P-channel MOS transistor 53 is 1:L. The ratio of the size of N-channel MOS transistor 56 to that of N-channel MOS transistor 57 is 1:1.

P-channel MOS transistor 51 is connected between the line of power-supply potential VCC and a node N51, and the gate thereof receives ground potential VSS. P-channel MOS transistor 51 forms a resistance element. N-channel MOS transistor 54 is connected between node N51 and the line of ground potential VSS, and the gate thereof receives a potential VBN of an output node N53. N-channel MOS transistor 55 is connected in parallel with N-channel MOS transistor 56, and the gate of N-channel MOS transistor 55 is connected to node N51.

At power input, VBN≈VSS is held, so that N-channel MOS transistor 54 is rendered conductive, node N51 is set to the "H" level, and N-channel MOS transistor 55 is rendered conductive. Thus, node N52 is set to the "L" level and hence relatively large current flows through P-channel MOS transistors 52, 53, rapidly raising potential VBN of node N53. When VBN is sufficiently high, N-channel MOS transistor 54 is rendered conductive, setting node N51 to be at the "L" level, and thus N-channel MOS transistor 55 is rendered non-conductive. As such, MOS transistors 51, 54 and 55 are provided in order to rapidly activate constant current circuit 41 at power input. In a steady state, constant current circuit 41 is driven as follows. In a region of subthreshold (near a threshold voltage) operation, current flowing through a channel of an MOS transistor is proportional to a size A of the MOS transistor, and is also proportional to an exponential function of a potential difference V (volt) between the gate and source, so that current i (ampere) flowing through the channel of the MOS transistor is represented by the equation (1) below when α and β are taken as proportionality constants.

$$i = \alpha A \exp(V/\beta) \quad (1)$$

In constant current circuit 41, the ratio of the size of N-channel MOS transistor 56 to that of N-channel MOS transistor 57 on both sides is 1:1, the sources of N-channel MOS transistors 56, 57 are both grounded, and the gates of N-channel MOS transistors 56, 57 are connected to the same node N53. Thus, N-channel MOS transistors 56 and 57 have an equal value of current flowing through the channel thereof. Moreover, output node N53 of constant current circuit 41 is connected only to the gate of an MOS transistor in another circuit so that no current flows in or flows out from/to another circuit, and therefore current of the same value flows through MOS transistors 52, 53, 56 and 57 according to the Kirchhoff's law.

Furthermore, the ratio of the size of P-channel MOS transistor 52 to that of P-channel MOS transistor 53 on both sides is 1:L, and the gates of P-channel MOS transistors 52, 53 are connected to the same node N52, so that a potential difference of ΔV (volt) is generated between the source of P-channel MOS transistor 52 and the source of P-channel MOS transistor 53, and thus P-channel MOS transistors 52, 53 have equal current flowing through the channels thereof. Because of the equal current value of P-channel MOS transistors 52 and 53, the equation (2) below can be established.

$$\exp(V/\beta) = L \exp[(V-\Delta)/\beta] \quad (2)$$

The potential difference ΔV is obtained from the equation (2) as ΔV=β log$_e$(L) . . . (3). The potential difference ΔV (volt) is a voltage between terminals of resistance element 50 of a resistance value R (ohm), so that a constant current value i0 generated by constant current circuit 41 is obtained by assigning the equation (3) to the ohm's law i0=ΔV/R . . . (4), and therefore i0=(β/R)log$_e$(L) . . . (5).

Figure 7:
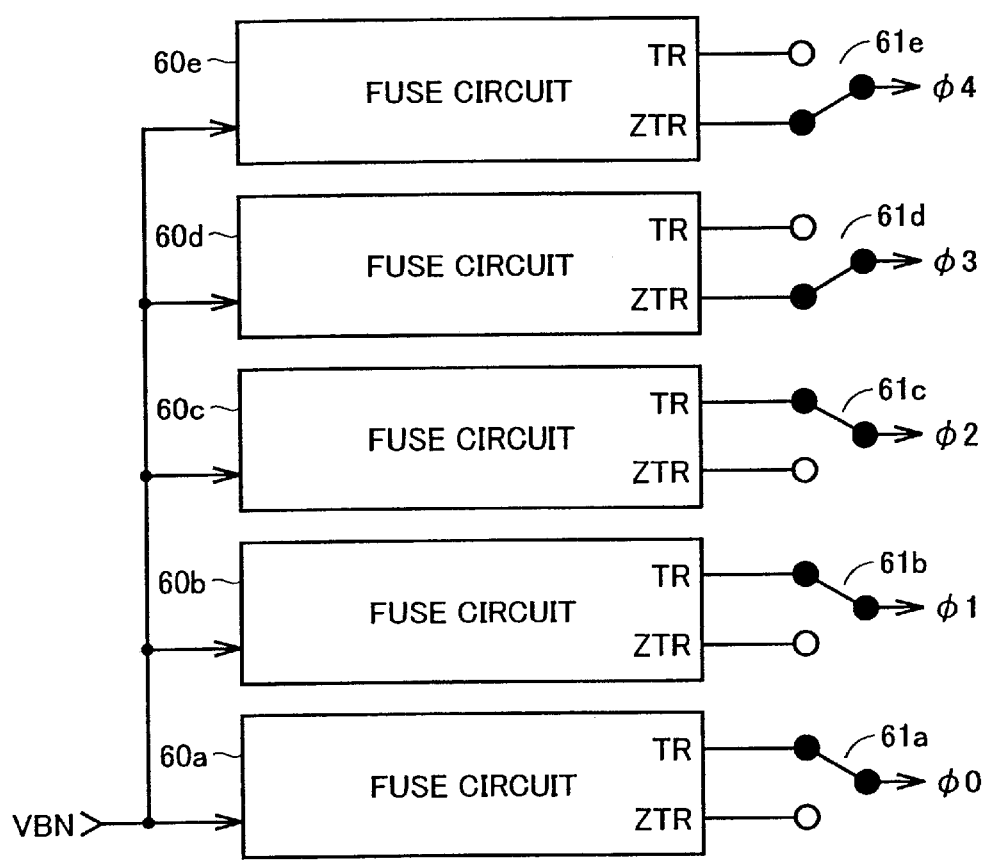
FIG. 7 is a circuit block diagram showing the configuration of a trimming switching circuit shown in FIG. 5.
Figure 8:
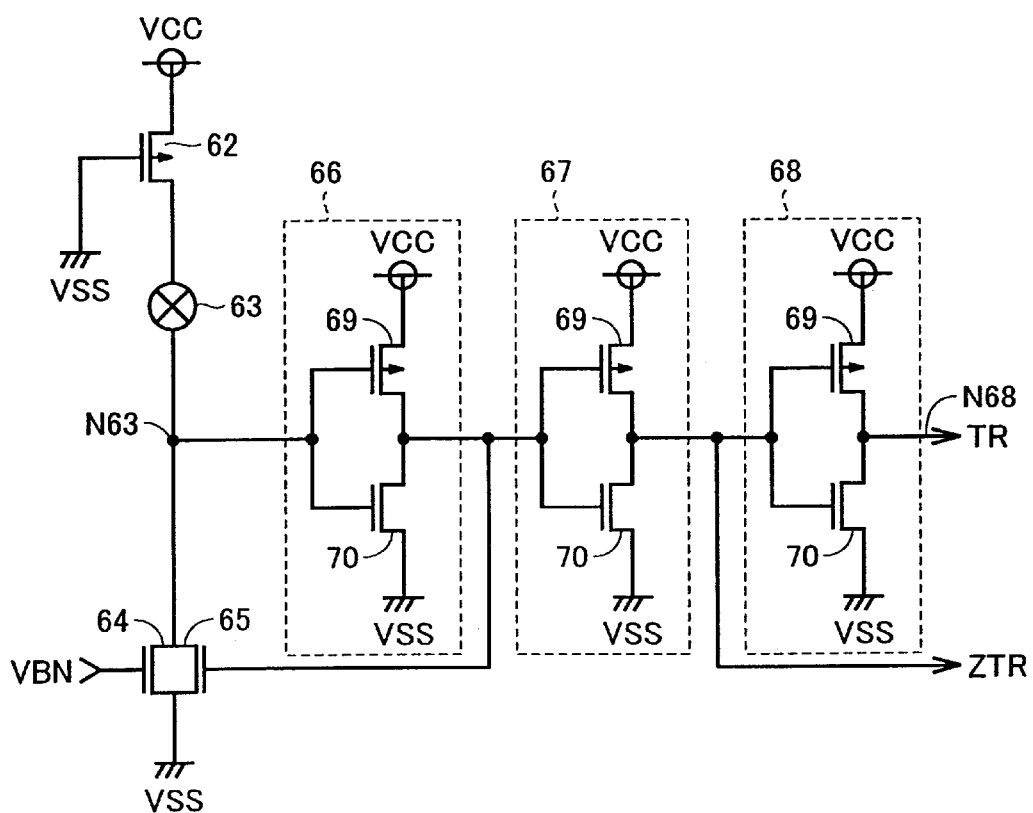
FIG. 8 is a circuit diagram showing the configuration of a fuse circuit shown in FIG. 7.

Trimming switching circuit 42 includes, as shown in FIG. 7, five fuse circuits 60a to 60e and five switches 61a to 61e. Fuse circuit 60a includes, as shown in FIG. 8, a P-channel MOS transistor 62, a fuse 63, N-channel MOS transistors 64, 65, and inverters 66 to 68. The source of P channel-MOS transistor 62 receives power-supply potential VCC, the gate of which is grounded, and the drain of which is connected to a node N63 via fuse 63. P-channel MOS transistor 62 forms a resistance element. N-channel MOS transistors 64 and 65 are connected in parallel between node N63 and the line of ground potential VSS. The gate of N-channel MOS transistor 64 receives output potential VBN of constant current circuit 41.

Inverters 66 to 68 are connected in series between node N63 and a node N68. Each of inverters 66 to 68 includes a P-channel MOS transistor 69 and an N-channel MOS transistor 70 connected in series between the line of power-supply potential VCC and the line of ground potential VSS. An output signal of inverter 68 is an output signal TR of fuse circuit 60a. An output signal of inverter 67 is an inversion output signal ZTR of fuse circuit 60a. An output signal of inverter 66 is input into the gate of N-channel MOS transistor 65. Inverter 66 and NMOS 65 constitute a half latch circuit.

When fuse 63 is not blown, current flowing from the line of power-supply potential VCC through N-channel MOS transistor 62 and fuse 63 into node N63 is larger than current flowing out of node N63 through N-channel MOS transistor 64 onto the line of ground potential VSS, and therefore node N63 is set to the "H" level. Thus, output signals TR, ZTR of fuse circuit 60a are set to the "L" level and "H" level respectively.

When fuse 63 is blown, node N63 is grounded via N-channel MOS transistor 64, so that output signals TR, ZTR of fuse circuit 60a are at the "H" level and "L" level respectively. It is noted that, here, an output signal of inverter 66 is at the "H" level, rendering N-channel MOS transistor 65 conductive, and node N63 is held at the "L" level. Each of the other fuse circuits 60b to 60e has the same configuration as that of fuse circuit 60a.

Referring again to FIG. 7, switches 61a to 61e are provided respectively corresponding to fuse circuits 60a to 60e. Each of the switches 61a to 61e selects one of output signals TR, ZTR of a corresponding one of fuse circuits 60a to 60e, and outputs the selected signal as each of signals φ0 to φ4. In FIG. 7, switches 61a to 61c select signal TR whereas switches 61d, 61e select signal ZTR. If signal TR is selected, signal φ is set to the "L" level when fuse 63 is not blown, and is set to the "H" level when fuse 63 is blown. If signal ZTR is selected, signal φ is set to the "H" level when fuse 63 is not blown whereas is set to the "L" level when fuse 63 is blown. Each of switches 61a to 61e is formed by a pattern of interconnection lines. Switches 61a to 61e can be switched by exchanging masks.

Figure 9:
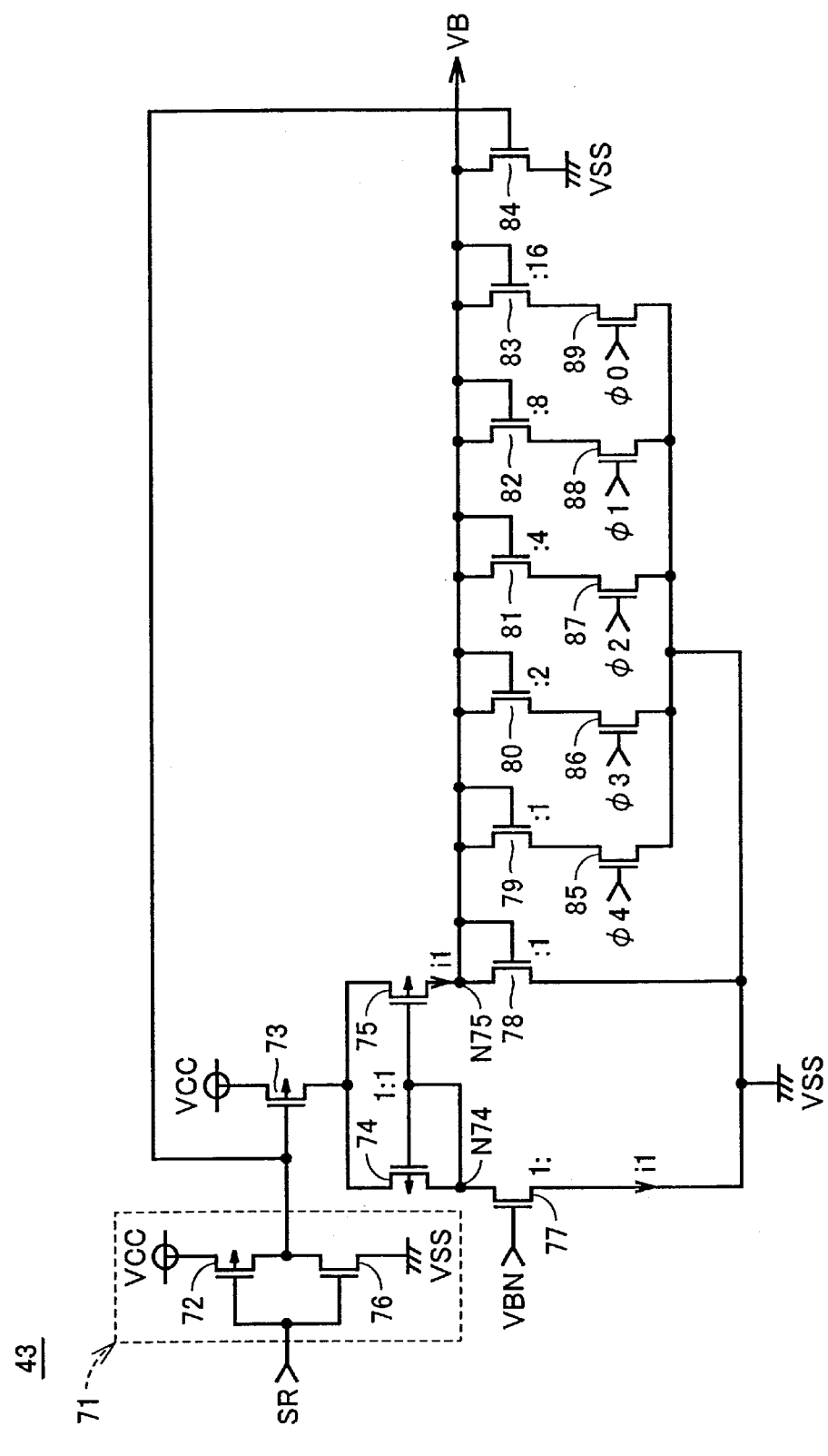
FIG. 9 is a circuit diagram showing the configuration of a voltage converting circuit shown in FIG. 5.

Voltage converting circuit 43 includes, as shown in FIG. 9, P-channel MOS transistors 72 to 75 and N-channel MOS transistors 76 to 89. P-channel MOS transistor 72 and N-channel MOS transistor 76 are connected in series between the line of power-supply potential VCC and the line of ground potential VSS, and the gates of which receive self-refresh instruction signal SR. P-channel MOS transistor 72 and N-channel MOS transistor 76 constitute an inverter 71.

The source of P-channel MOS transistor 73 receives power-supply potential VCC, and the gate of which receives an output signal of inverter 71. P-channel MOS transistors 74, 75 are connected between the drain of P-channel MOS transistor 73 and nodes N74, N75, respectively, and the gates of which are both connected to a node N74. P-channel MOS transistors 74 and 75 constitute a current mirror circuit. The ratio of the size of P-channel MOS transistor 74 to that of P-channel MOS transistor 75 is set to be 1:1.

N-channel MOS transistors 77, 78 are connected between nodes N74, N75 respectively and the line of ground potential VSS, the gates of which receive output potential VBN of constant current circuit 41 and potential VB of output node N75 respectively. The gates and drains of N-channel MOS transistors 79 to 83 are all connected to output node N75. The drains of N-channel MOS transistors 85 to 89 are connected to the sources of N-channel MOS transistors 79 to 83 respectively. The gates of N-channel MOS transistors 85 to 89 receive output signals φ4 to φ0 from trimming switching circuit 42 respectively, and the sources of which are all grounded. The sizes of N-channel MOS transistors 77 to 83 are set to be in the ratio of 1:1:1:2:4:8:16. N-channel MOS transistor 84 is connected between output node N75 and the line of ground potential VSS, the gate of which receives the output signal of inverter 71.

P-channel MOS transistors 74, 75 and N-channel MOS transistors 77 to 83, 85 to 89 constitute a differential amplifier, and P-channel MOS transistors 72, 73 and N-channel MOS transistors 76, 84 constitute a circuit controlling activation/inactivation of the differential amplifier. When signal SR is at an inactivated level of "L" level, P-channel MOS transistor 73 is rendered conductive while N-channel MOS transistor 84 is rendered conductive, and the differential amplifier is inactivated while output potential VB is fixed at ground potential VSS. When signal SR is at an activated level of "H" level, P-channel MOS transistor 73 is rendered conductive while N-channel MOS transistor 84 is rendered non-conductive, and thus the differential amplifier is activated.

As N-channel MOS transistor 77 and N-channel MOS transistor 57 in FIG. 6 constitute a current mirror circuit, if the ratio of the size of N-channel MOS transistor 57 to that of N-channel MOS transistor 77 is assumed to be 1:K, the relation between constant current value i0 flowing through N-channel MOS transistor 57 in FIG. 6 and a current value i1 flowing through the channel of N-channel MOS transistor 77 is represented as i1=Ki0 . . . (6). Using the equation (5), the equation (6) can also be represented as i1=(Kβ/R) $\log_e(L)$ . . . (7). Moreover, N-channel MOS transistor 77 and P-channel MOS transistor 74 are connected in series, the ratio of the size of P-channel MOS transistor 74 to that of P-channel MOS transistor 75 is 1:1, and P-channel MOS transistors 74 and 75 constitute a current mirror circuit. Therefore, the value of current flowing through the channels of P-channel MOS transistors 74, 75 is also equal to i1.

A total sum M of the sizes of N-channel MOS transistors connected between node N75 and the line of ground potential VSS is set to be an integer value within the range between 1 and 32 by output signals φ0 to φ4 of trimming switching circuit 42. As the ratio of the sizes of N-channel MOS transistors on both sides of the differential amplifier is 1:M, the relation between current value i1 and output voltage VB of voltage converting circuit 43 is, as in the case with the equation (1), i1=αKM$_{exp}$(VB/β) . . . (8). Therefore, from the equations (7) and (8), output potential VB of voltage converting circuit 43 is represented by the equation (9) below.

$$VB=\beta \log_e[(\beta/\alpha MR)\log_e(L)] \quad (9)$$

Figure 10:
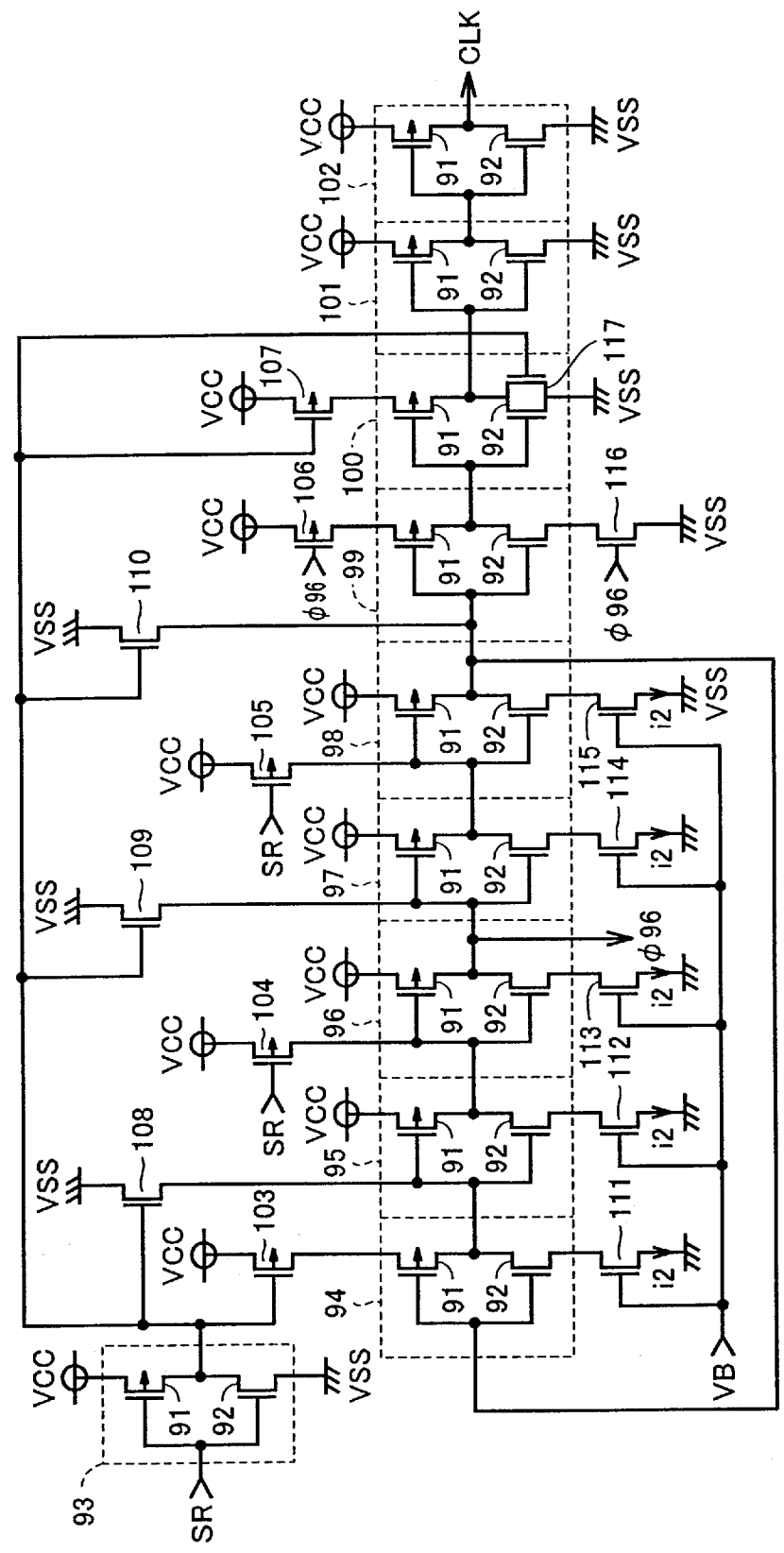
FIG. 10 is a circuit diagram showing the configuration of a voltage control oscillation circuit shown in FIG. 5.

Voltage control oscillation circuit 44 includes, as shown in FIG. 10, inverters 93 to 102, P-channel MOS transistors 103 to 107, and N-channel MOS transistors 108 to 117. Each of inverters 93 to 102 includes a P-channel MOS transistor 91 and an N-channel MOS transistor 92 connected in series between the power-supply node and the ground node. The gates of MOS transistors 91, 92 are both connected to an input node of a corresponding inverter, and the drains of which are connected to an output node of the corresponding inverter. Inverters 94 to 98 are connected in a ring manner to form a ring oscillator. N-channel MOS transistors 111 to 115 are connected between ground nodes of inverters 94 to 98 respectively and the line of ground potential VSS, and the gates of which all receive output potential VB of voltage converting circuit 43. An oscillation cycle of the ring oscillator depends on VB. An output signal of inverter 98 is delayed at inverters 99 to 102 to be an output clock signal CLK of voltage control oscillation circuit 44.

Inverter 93, P-channel MOS transistors 103 to 107, and N-channel MOS transistors 108 to 110, 116, 117 control activation/inactivation of voltage control oscillation circuit 44. The power-supply nodes of inverters 93, 95 to 98, 101, 102 are connected to the line of power-supply potential VCC, and the ground nodes of inverters 93, 100 to 102 are connected to the line of ground potential VSS. P-channel MOS transistors 103, 106 and 107 are connected between the power-supply nodes of inverters 94, 99, 100 respectively, and the line of power-supply potential VCC. P-channel MOS transistors 104, 105 are connected between input nodes of inverters 96, 98 respectively and the line of power-supply potential VCC. N-channel MOS transistors 108 to 110 are connected between input nodes of inverters 95, 97, 99 respectively and the line of ground potential VSS. N-channel MOS transistor 117 is connected in parallel with N-channel MOS transistor 92 of inverter 100. Self-refresh instruction signal SR is input into the gates of N-channel MOS transistors 108 to 110, 117 and P-channel MOS transistors 103, 107, via inverter 93, while it is directly input into the gates of P-channel MOS transistors 104, 105. An output signal φ96 of inverter 96 is input into the gates of MOS transistors 106, 116.

When self-refresh instruction signal SR is at an inactivated level of "L" level, P-channel MOS transistors 103, 107 and N-channel MOS transistor 116 are rendered non-conductive, while P-channel MOS transistors 104 to 106 and N-channel MOS transistors 108 to 110, 117 are rendered conductive, and thus output signals of inverters 94 to 102 are fixed alternately at "L" and "H" levels. Therefore, in such a case, no clock signal CLK is generated. When self-refresh instruction signal SR is at the activated level of "H" level, P-channel MOS transistors 103, 107 are rendered conductive while P-channel MOS transistors 104, 105 and N-channel MOS transistors 108 to 110, 117 are rendered non-conductive, and thus voltage control oscillation circuit 44 is activated.

A cycle τ (seconds) of output clock signal CLK of voltage control oscillation circuit 44 is determined by discharge current i2 flowing through each of N-channel MOS transistors 111 to 115. Therefore, if the ratio of the size of each of N-channel MOS transistors 111–115 to that of N-channel MOS transistor 57 of constant current circuit 41 is set to be 1:N, a current value i2 (ampere) is obtained from the equation (1) as i2=αNexp(VB/β) . . . (10), and is also represented using the equation (9) as i2=(N/M)(β/R) $\log_e(L)$ . . . (11). The capacitive load of each inverter constituting the ring oscillator is indicated by C (farad), an amplitude of an output voltage at oscillation is indicated by V (volt) and the number of odd-numbered stages of inverters in the ring oscillator is indicated by P (5 in FIG. 10). Then, oscillation cycle τ (seconds) of the ring oscillator is represented as τ=PCV/i2 . . . (12), which can also be represented, using the equation (11), as τ=(M/N)PCVR/[β $\log_e(L)$] . . . (13).

Therefore, oscillation cycle τ (seconds) is proportional to a ratio M/N of total sum M of the sizes of a plurality of N-channel MOS transistors selected from N-channel MOS transistors 78 to 83 on the right side in voltage converting circuit 43, to the size N of one of N-channel MOS transistors 111 to 115 in voltage control oscillation circuit 44.

It is noted that the proportional constant β is dependent to a manufacturing condition of DRAM, having no generic value. However, a subthreshold coefficient S (millivolt/decade) corresponding to the change in a current value by one order, i.e. by ten times, may be determined and equations $i=\alpha A\exp(V/B)$ ... (14) and $10i=\alpha A\exp[(V+S)/\beta]$ ... (15) may be used, to experimentally obtain $\beta=S/\log_e(10)$ ... (16). Thus, oscillation cycle τ (seconds) is represented as τ=(M/N) PCVR/[S log 10(L)] ... (17).

Referring again to FIG. 5, address counter 45 is activated by self-refresh instruction signal SR, and counts e.g. a rising edge of output clock signal CLK of voltage control oscillation circuit 44, and outputs address signals A0 to A11. Therefore, address signals A0 to A11 are incremented at same cycles as that of clock signal CLK. Everytime one of address signals A0 to A11 is output, data in one memory cell row is refreshed. When address counter 45 counts up, refresh of data is terminated for all the memory cell rows in the DRAM.

Figure 11:
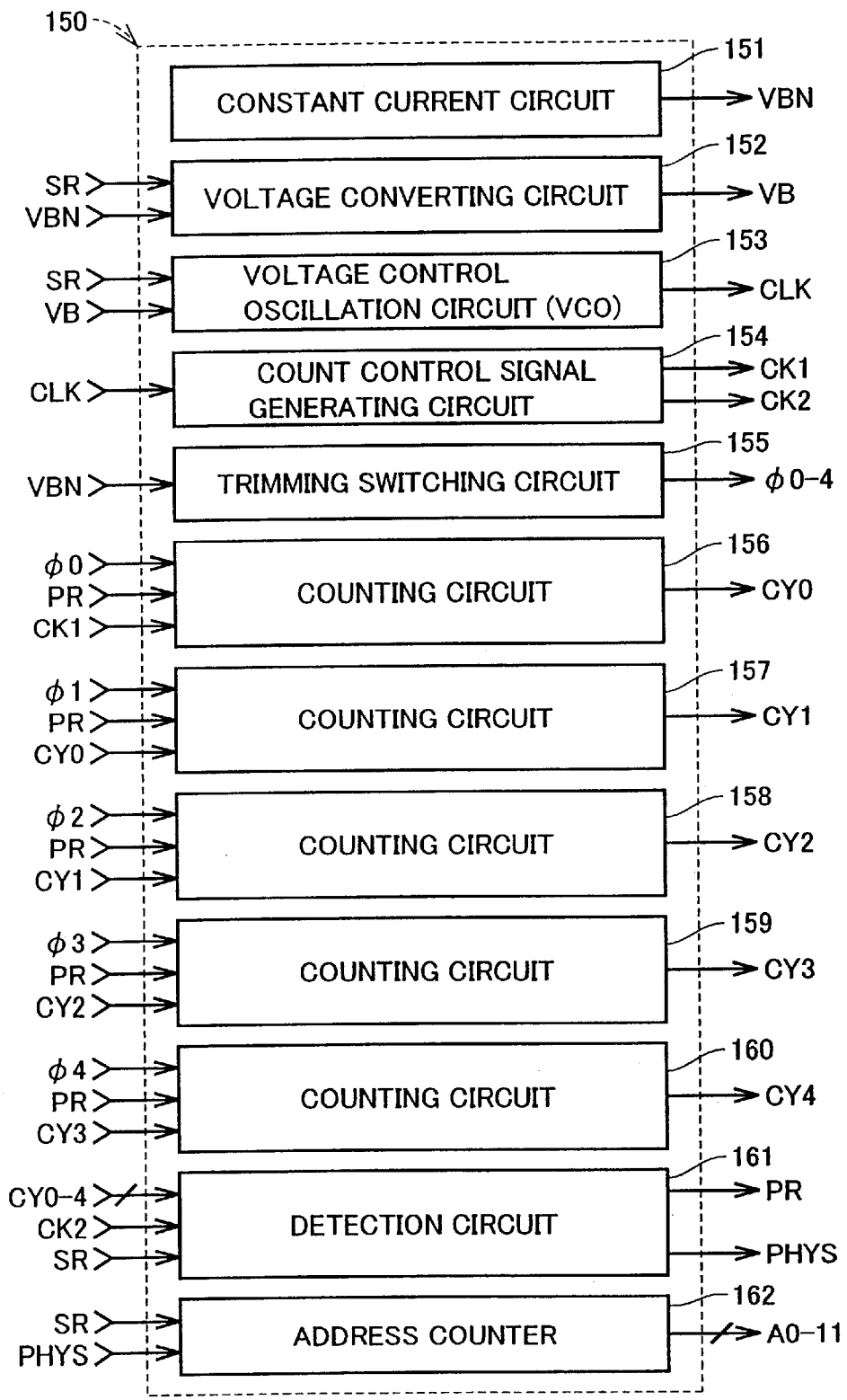
FIG. 11 is a block diagram showing the configuration of the conventional address generating circuit.
Figure 12:
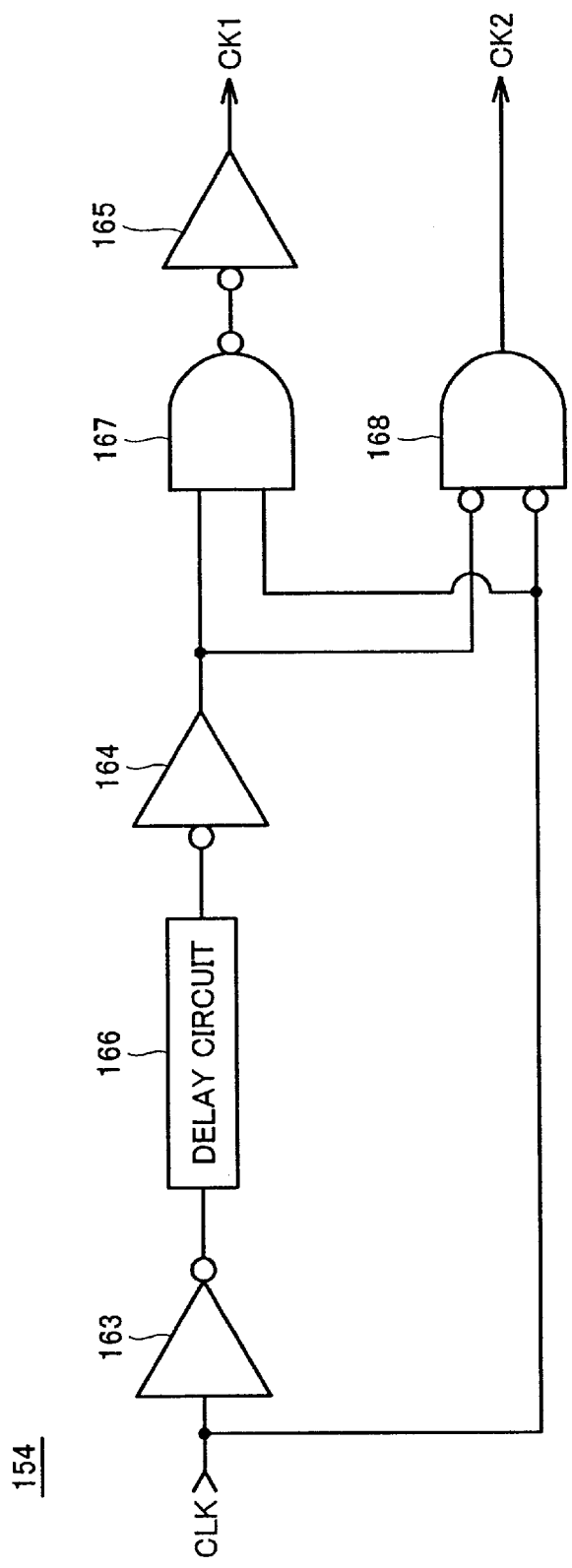
FIG. 12 is a circuit diagram showing the configuration of the count control signal generating circuit shown in FIG. 11.
Figure 13:
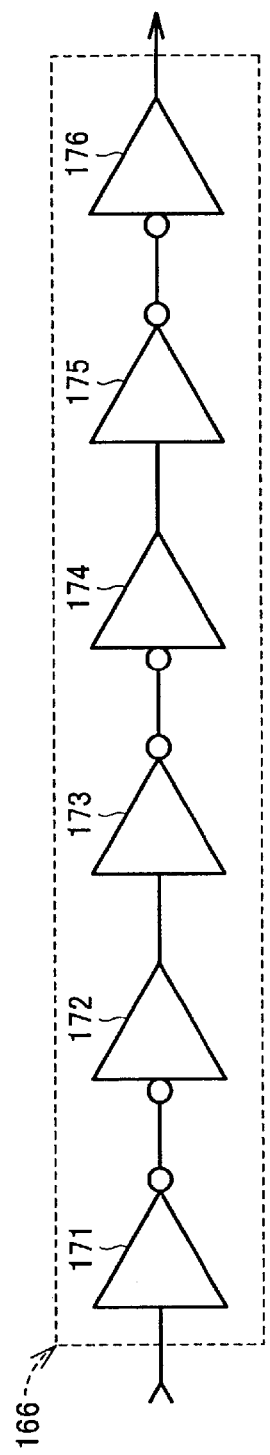
FIG. 13 is a circuit diagram showing the configuration of the delay circuit shown in FIG. 12.
Figure 14:
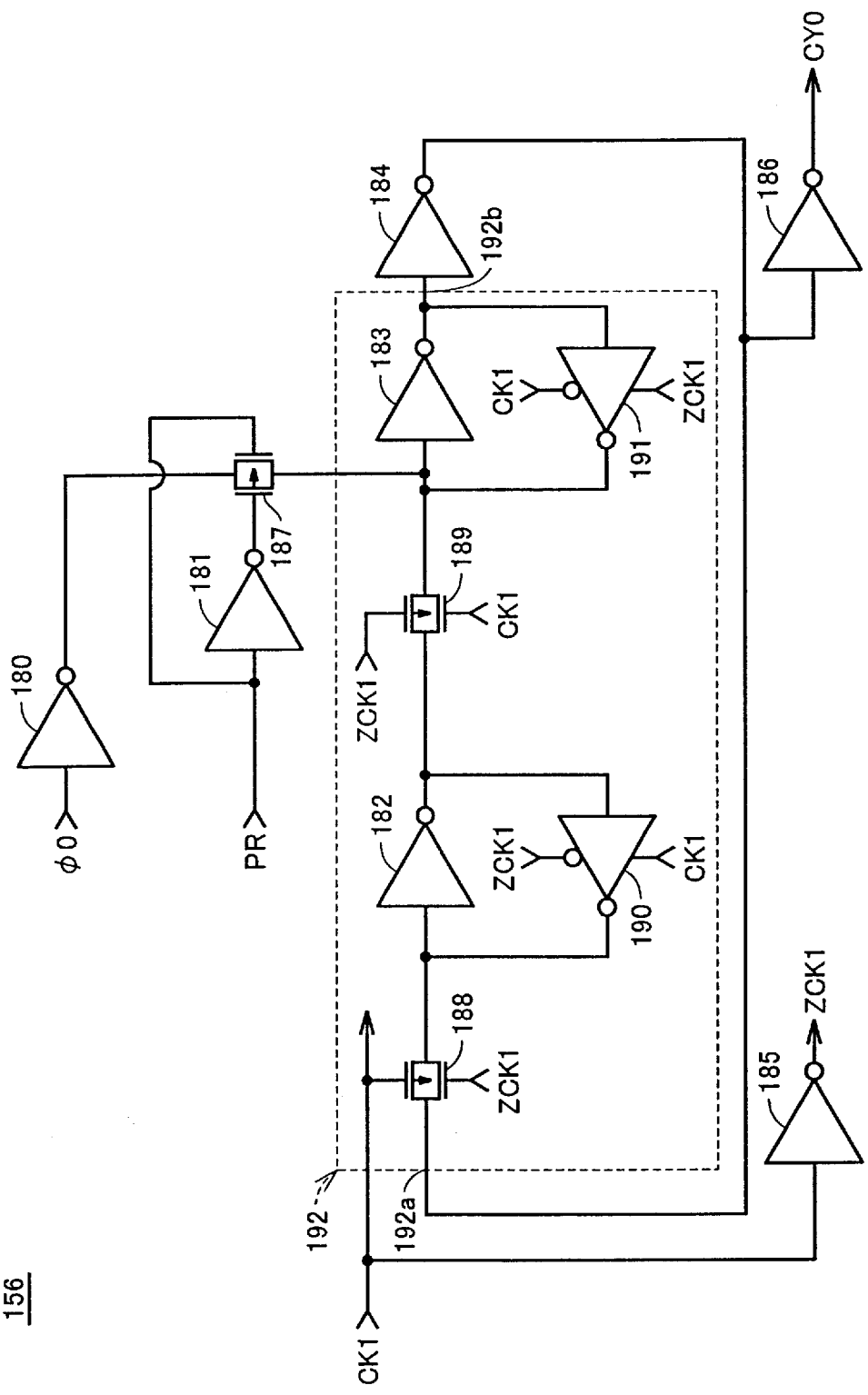
FIG. 14 is a circuit diagram showing the configuration of counting circuit 156 shown in FIG. 11.
Figure 15:
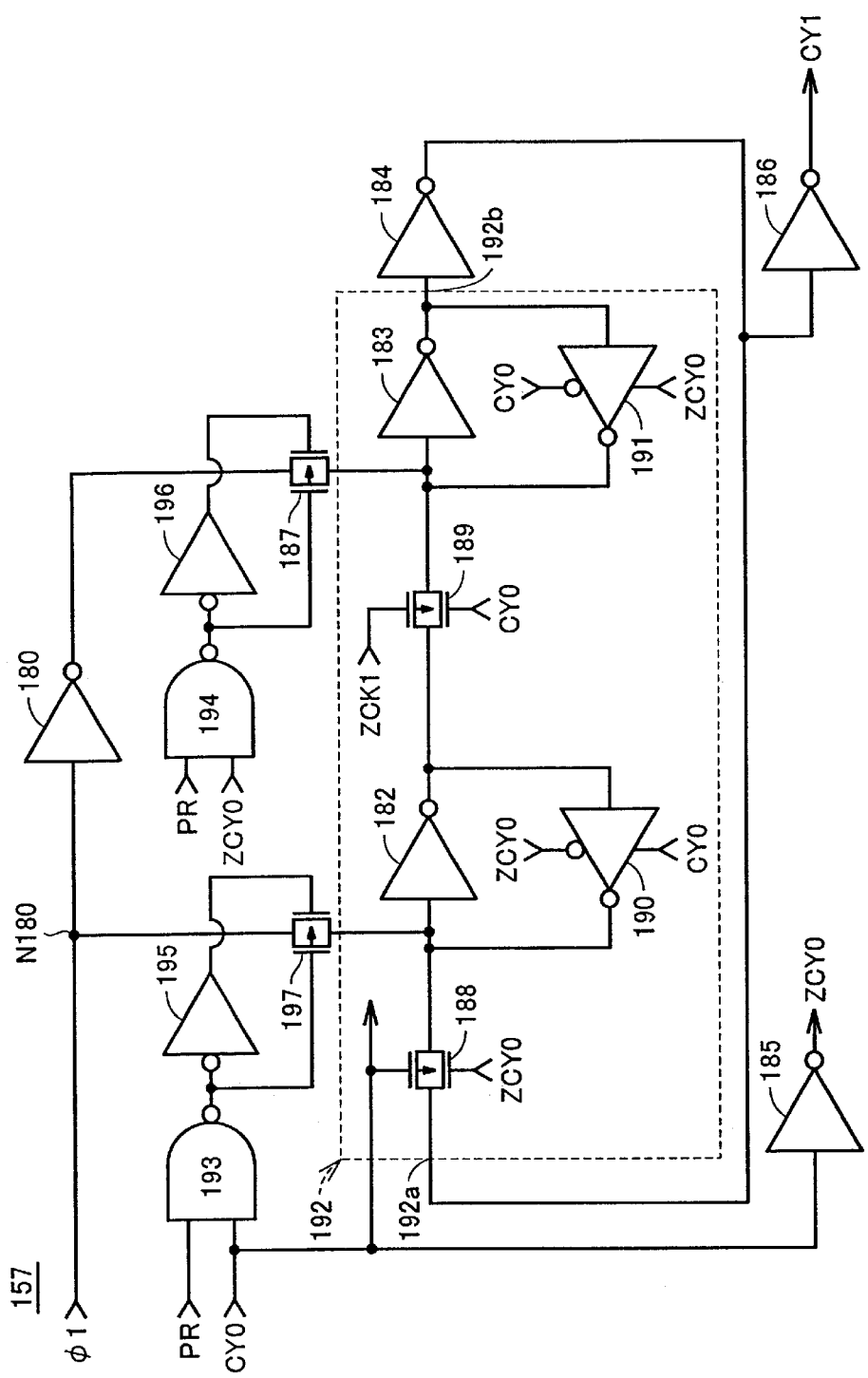
FIG. 15 is a circuit diagram showing the configuration of counting circuit 157 shown in FIG. 11.
Figure 16:
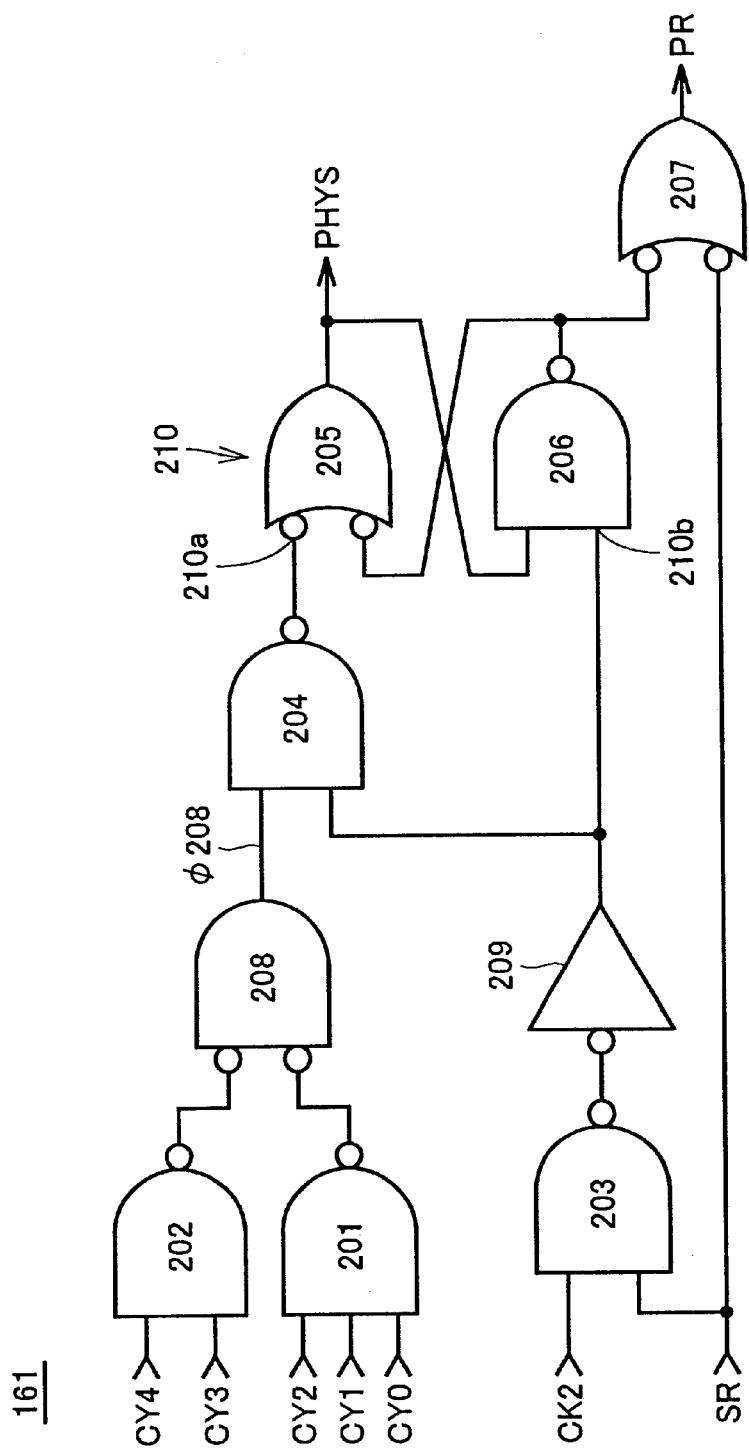
FIG. 16 is a circuit diagram showing the configuration of the detection circuit shown in FIG. 11.

According to the present embodiment, the circuit scale and power consumption can be reduced compared to the conventional address generating circuit 150 in FIG. 11 by the amount corresponding to count control signal generating circuit 164, five counting circuits 156 to 160 and detection circuit 161.

Moreover, the frequency of output clock signal CLK of voltage control oscillation circuit 44 is considerably lower than the frequency of output clock signal CLK of the conventional voltage control oscillation circuit 153, so that charge/discharge current at voltage control oscillation circuit 44 can be made small, and therefore power consumption can be reduced.

Although the present invention has been described and illustrated in detail, it is clearly understood that the same is by way of illustration and example only and is not to be taken by way of limitation, the spirit and scope of the present invention.

What is claimed is:

1. A semiconductor memory device, provided with a plurality of memory cell rows and having a self-refresh mode, comprising:

a voltage control oscillation circuit generating a clock signal with a cycle according to a control voltage;

a refresh execution circuit activated during said self-refresh mode, to sequentially select said plurality of memory cell rows in synchronization with said clock signal and to refresh data in selected memory cell rows;

a signal generating circuit including at least one fuse, and outputting a signal for setting a cycle of said clock signal based on whether or not the fuse is blown; and a voltage generating circuit generating said control voltage for said voltage control oscillation circuit in accordance with an output signal of said signal generating circuit.

2. The semiconductor memory device according to claim 1, wherein said voltage generating circuit includes
a constant current circuit supplying constant current of a predetermined value to an output node for outputting said control voltage,
a plurality of diode elements, and
a switching circuit selecting any one or more of said plurality of diode elements in accordance with an output signal of said signal generating circuit, and connecting each selected diode element between said output node and a line of a reference potential.

3. The semiconductor memory device according to claim 2, wherein said diode element includes a transistor whose input electrode and one conduction electrode are connected, and
a plurality of transistors included in said plurality of diode elements have different sizes.

4. The semiconductor memory device according to claim 3, wherein the sizes of said plurality of transistors are sequentially doubled.

5. The semiconductor memory device according to claim 2, wherein said switching circuit of said voltage generating circuit includes a plurality of switching elements provided to correspond to said plurality of diode elements respectively, each of said plurality of switching elements being connected in series with a corresponding diode element, between said output node and the line of said reference potential,
said fuse of said signal generating circuit is provided in a number equal to the number of said switching elements, to correspond to each of said switching elements, and
said signal generating circuit further includes a driving circuit provided corresponding to each fuse, to render a corresponding switching element conductive or non-conductive in response to a corresponding fuse being blown.

6. The semiconductor memory device according to claim 5, wherein said signal generating circuit further includes a selection circuit selecting whether said driving circuit renders a corresponding switching element conductive or non-conductive, in response to a corresponding fuse being blown.

* * * * *